(12) United States Patent
Savelli et al.

(10) Patent No.: US 9,182,294 B2
(45) Date of Patent: Nov. 10, 2015

(54) DIFFERENTIAL TEMPERATURE SENSOR AND ITS CAPACITORS IN CMOS/BICMOS TECHNOLOGY

(75) Inventors: Guillaume Savelli, Grenoble (FR); Denis Cottin, Crolles (FR)

(73) Assignees: COMMISSARIAT A L'ENERGIE ATOMIQUE ET AUX ENERGIES ALTERNATIVES, Paris (FR); ST-ERICSSON SA, Plan-les-Quates (CH)

( * ) Notice: Subject to any disclaimer, the term of this patent is extended or adjusted under 35 U.S.C. 154(b) by 0 days.

(21) Appl. No.: 14/006,877

(22) PCT Filed: Mar. 15, 2012

(86) PCT No.: PCT/FR2012/000094
§ 371 (c)(1),
(2), (4) Date: Sep. 23, 2013

(87) PCT Pub. No.: WO2012/131183
PCT Pub. Date: Oct. 4, 2012

(65) Prior Publication Data
US 2014/0015089 A1    Jan. 16, 2014

(30) Foreign Application Priority Data
Mar. 25, 2011   (FR) .................................... 11 00894

(51) Int. Cl.
*H01L 31/058* (2006.01)
*G01K 7/02* (2006.01)
*H01L 35/34* (2006.01)

(52) U.S. Cl.
CPC ................ *G01K 7/028* (2013.01); *H01L 35/34* (2013.01)

(58) Field of Classification Search
CPC ......... H01L 35/00; H01L 35/02; H01L 35/12; H01L 35/22; H01L 35/26; H01L 35/28; H01L 35/30; H01L 35/32; G01K 7/028
USPC .............. 257/467, E29.347; 438/54
See application file for complete search history.

(56) References Cited

U.S. PATENT DOCUMENTS

| 5,156,688 A * | 10/1992 | Buhler et al. ................. 136/211 |
| 8,829,639 B2 * | 9/2014 | Remondiere et al. ......... 257/467 |
| 2004/0208345 A1 * | 10/2004 | Chou et al. ..................... 382/124 |
| 2009/0260669 A1 * | 10/2009 | Anderson et al. ............. 136/233 |
| 2011/0241155 A1 * | 10/2011 | Trifonov ........................ 257/470 |
| 2012/0217608 A1 | 8/2012 | Remondière et al. |

FOREIGN PATENT DOCUMENTS

| FR | 2 113 383 | 6/1972 |
| WO | WO 2011/012586 A1 | 2/2011 |
| WO | WO 2011012586 A1 * | 2/2011 |

OTHER PUBLICATIONS

W. H. Lee et al., "Fabrication of Thermoelectric Sensor Using Silicon-on-Insulator Structure", Japanese Journal of Applied Physics, vol. 46, No. 11, 2007, pp. 7232-7236.*
Najafi, "Silicon Integrated Microsensors," Integrated Optics and Microstructures, 1992, vol. 1793, pp. 235-246.
Aldrete-Vidrio et al., "Differential Temperature Sensors in 0.35μm CMOS Technology," Therminic, 2005, pp. 122-128.
Jun. 25, 2012 International Search Report issued in International Application No. PCT/FR2012/000094.

* cited by examiner

*Primary Examiner* — Meiya Li
*Assistant Examiner* — Peter M Albrecht
(74) *Attorney, Agent, or Firm* — Oliff PLC

(57) ABSTRACT

The sensor is made on a semiconductor substrate covered with an electrically insulating layer. The electrically insulating layer separates a thermocouple from the substrate. It includes a first portion presenting a first value of capacitance per unit area and a second portion presenting a second value of capacitance per unit area, which is lower than the first value. The sensor includes first and second output terminals connected to the thermocouple. The first output terminal includes a first capacitor having a first electrode formed by a first leg made of an electrically conducting material. The second electrode of the capacitor is formed by a part of the substrate facing said first leg and separated from the first electrode by the first portion of the electrically insulating layer. The first leg connects the thermocouple while overlapping the second portion of the electrically insulating layer.

12 Claims, 4 Drawing Sheets

DIFFERENTIAL TEMPERATURE SENSOR AND ITS CAPACITORS IN CMOS/BICMOS TECHNOLOGY

CROSS-REFERENCES TO RELATED APPLICATIONS

This application is a national stage of International Application No. PCT/FR 2012/000094, filed on Mar. 15, 2012, and to French Patent Application No. 1 100 894, filed on Mar. 25, 2011, the disclosures of both of which are incorporated herein by reference in their entireties.

BACKGROUND OF THE INVENTION

The invention relates to the field of temperature sensors, and more precisely to that of Seebeck effect differential sensors.

The invention also relates to a method for co-integration of a Seebeck effect differential sensor and a field effect transistor.

STATE OF THE ART

With the increase of the integration density, the power dissipated in micro-electronic devices is continually increasing. The increase of the dissipated power can generate a phenomenon called self-heating, which is responsible for degradation of certain physical and electrical characteristics of the micro-electronic devices. For example, the mobility of the carriers which depends greatly on the temperature can be impaired under these conditions. An impairment of the mobility of the carriers proves detrimental for the switching speed of microelectronic devices in particular, and for the execution speed of the integrated circuit functions in general.

At the present time, certain integrated circuits produced using the CMOS technology comprise a dynamic power control and management system. Such a system is connected to several thermal sensors placed at different critical points of the integrated circuit. When the temperature exceeds a certain threshold, the dynamic power management system can for example trigger a fan or suspend the activity of certain devices. The efficiency of this type of system depends on the information on the heating state of the integrated circuit.

A need to implement precise temperature sensors compatible with CMOS or BiCMOS technologies has thus arisen. These thermal sensors can be achieved by p-n junctions simultaneously integrated with the active devices of the electronic circuit. The temperature detected by this active sensor is obtained by measuring the voltage at the terminals of the diode formed in the substrate. This type of temperature sensor is not very precise and consumes a permanent current which, although it is low, is very sensitive to the disturbances caused by capacitive coupling with the dense interconnections within the integrated circuits. Furthermore, these sensors, made from silicon as the associated circuits, are also sensitive to the stray currents created by operation of the circuit. In this context, this type of thermal sensor can be considered as not being suitable for dense integrated circuits with high frequencies of use.

Another type of thermal sensors exists that is passive and precise. These are differential sensors which use the Seebeck effect and which do not consume any current. They comprise one or more thermocouples arranged in a temperature gradient between a cold source and a hot source.

An example of this type of integrated differential sensor in CMOS technology is described in the article entitled "Differential temperature sensors in 0.35 µm CMOS technology" written by E. Aldrete-Vidrio et al. and published at the THERMINIC 2005 conference, Belgirate, Lago Maggiore, Italy.

These sensors were made on a silicon substrate. They comprise several parallel legs electrically connected in series. One end of these legs is arranged at the level of a cold source and the other end is arranged at the level of a hot source. In this study, the legs were formed by a polycrystalline silicon base. The length of the legs is about 500 µm, and their thickness is about 0.65 µm. It was thus possible to form several thermocouples electrically connected in series and thermally connected in parallel.

Generally, the sensitivity of a thermocouple formed by polycrystalline silicon legs is about a few hundred µV/° C. The voltages at the output terminals of such sensors are thus in general about mV/° C. This voltage can be considered as being low compared with the voltages applied to the terminals of the usual active devices of integrated circuits. These voltages can reach values of about 1 to 10 V or even more.

Furthermore, to monitor the temperature of the hot points as best as possible, these differential sensors are placed close to the integrated circuit and not close to the dynamic power management circuit. Consequently, the distances between the temperature sensors and the management circuit can range between a few tens and a few hundreds of micrometres and even reach one millimetre inside the integrated circuit.

Under these conditions, the electric connections connecting the temperature sensors and the management circuit can be arranged in proximity to the numerous interconnections. These interconnection lines can convey electric signals having considerably greater amplitudes than the amplitude of the voltage at the output terminals of the differential sensor. This results in electric disturbances caused by capacitive couplings being able to impair transmission of the electric signal from the sensor to the management circuit. Management of the dynamic power of the integrated circuit can therefore be performed on the basis of biased temperature values in spite of the precision of the differential sensors.

Particular attention therefore has to be paid to the recovery operations of the signal at the output terminals of the sensor and to transmission of the latter to the power management system. Active and/or passive devices can be connected downline from the sensor in order to improve the efficiency of these operations. Integration of the microelectronic circuit then becomes more complex and more costly.

OBJECT OF THE INVENTION

In certain applications, a thermoelectric device would be required in addition enabling a temperature difference to be efficiently detected and communicated to another device while at the same time avoiding drawbacks linked to electric disturbances. This requirement tends to be satisfied by providing a thermoelectric device comprising a substrate made from semiconducting material; an electrically insulating layer covering one surface of the substrate; a thermocouple separated from the substrate by the electrically insulating layer; and first and second output terminals connected to the thermocouple. The electrically insulating layer is formed so as to comprise a first portion presenting a first value of capacitance per unit area and a second portion presenting a second value of capacitance per unit area that is lower than the first value; the first output terminal comprises a first capacitor having a first electrode formed by a first leg made from electrically conducting material and a second electrode formed on the one hand by the substrate facing said first leg and separated from the first electrode by the first portion of the electrically insulating layer. The first leg is arranged so as to overlap the second portion of the electrically insulating layer to connect the thermocouple.

According to one embodiment, the second output terminal comprises a second capacitor having a first electrode formed by a second leg made from electrically conducting material and a second electrode formed by a part of the substrate facing said second leg and separated from the first electrode by the first portion of the electrically insulating layer. The second leg is arranged so as to overlap the second portion of the electrically insulating layer to connect the thermocouple.

According to another embodiment, an area of the substrate facing the first portion of the electrically insulating layer is doped so as to form a P/N junction with an adjacent area of the substrate.

According to another embodiment, the first leg and the second electrode of the capacitor of the first output terminal are respectively electrically connected to a first metallic line and to a second metallic line in such a way that said first and second metallic lines are separated from one another by a layer made from electrically insulating material and that they are arranged in a plane that is parallel to and different from the plane of the first leg.

According to one embodiment, the first and second legs are made from doped semiconducting materials and participate in formation of at least one thermocouple.

According to another embodiment, the first leg connecting a thermoelectric junction to the first output has a first type of conductivity and the second leg has a first portion with a first type of conductivity and a second portion with a second type of conductivity, so that the first portion of the second leg and the first leg have the same type of conductivity above the first portion of the electrically insulating layer, said first and second portions of the second leg being aligned.

According to one embodiment, the thermoelectric device comprises a layer having a base formed by metallic material which forms a short-circuit between the first and second portions of the second leg.

According to one embodiment, the first portion of the electrically insulating layer presents a first thermal resistance value and the second portion of the electrically insulating layer presents a second thermal resistance value that is higher than the first value.

According to another embodiment, the thermoelectric device comprises a plurality of thermocouples connected in series, each thermocouple comprising two legs connected by a thermoelectric link, the first leg being the longer of the legs of the thermoelectric device.

According to one embodiment, the thickness of the first portion of the electrically insulating layer is comprised between 3 and 200 Å.

Implementation of a fabrication method of a thermoelectric device using a substrate made from a semiconducting material having a first type of conductivity and comprising an electrically insulating layer covering one surface of the substrate is also provided; said electrically insulating layer comprises first and third portions presenting first values of capacitance per unit area and of thermal conductance; and a second portion presenting second values of capacitance per unit area and of thermal conductance that are respectively lower than the first values. The method comprises a step of simultaneous formation of first and second legs made from electrically conducting material extending above the first and second portions of the electrically insulating layer; and a third leg made from electrically conducting material above the third portion of the electrically insulating layer. The method also comprises a doping step of the first, second and third legs enabling formation of a thermocouple by means of the first and second legs and of a MOS transistor by means of the third leg.

According to one embodiment, before formation of the first, second and third legs, first and second areas are formed in the substrate, the first and second areas having a second type of conductivity and being respectively facing the first and third portions of the electrically insulating layer.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF A PREFERRED EMBODIMENT OF THE INVENTION

In order to benefit from the advantages of a management system of the dissipated power in an integrated circuit, it is preferable for this system to be associated with passive thermal sensors that are precise and easy to produce.

It is therefore advantageous to take advantage of Seebeck effect differential sensors produced by means of integrated circuit technology while at the same time avoiding electric disturbances which may occur on the output terminals of these sensors.

To overcome these drawbacks, it is envisaged to produce a differential thermal sensor that is electrically insulated from the substrate and provided with a capacitor connected in parallel with at least one of the two output terminals of the sensor, preferably with both of the output terminals of the sensor.

Figure 1:
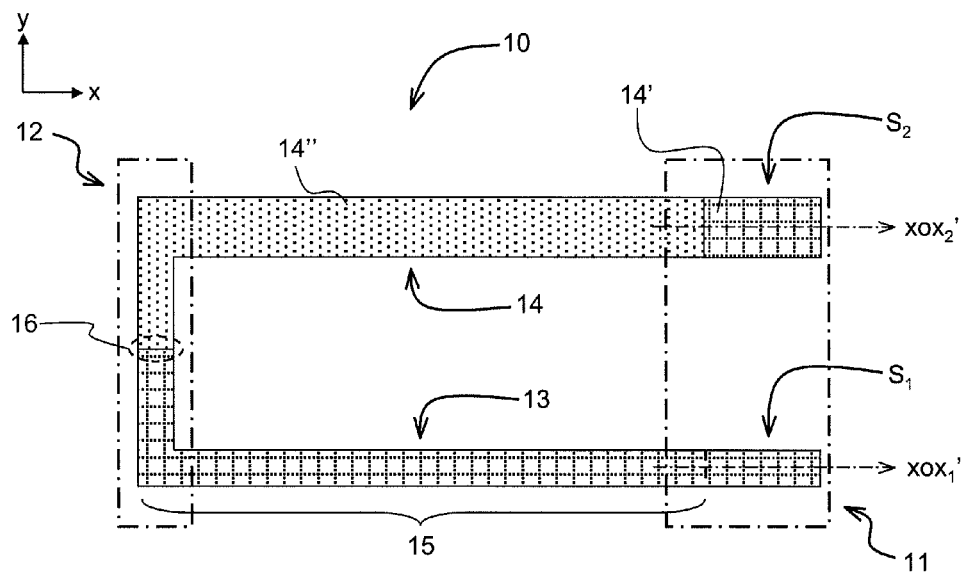
FIG. 1 schematically illustrates a top view of an embodiment of a thermoelectric device.

FIG. 1 schematically illustrates a top view of an embodiment of a thermo-electric device 10 which tends to meet these requirements. In operation, device 10 is arranged in a temperature gradient defined between a hot source and a cold source. One end of device 10 is then situated at the level of a first side 12 located in proximity to a first source, for example a heat source, and the other end is situated at the level of a second side 11 arranged so as to be thermally connected with a second source which is a reference source or a cold source. For the sake of clarity, the terms "hot side" and "cold side" will be used to respectively designate first side 12 and second side 11. For example purposes, a hot source can be formed by one or more active and/or passive components which, by dissipating a certain electric power, can generate a temperature increase. In an alternative embodiment, the position of the hot and cold sources can be reversed.

Thermoelectric device 10 comprises at least one thermocouple 15. This thermocouple generates a potential difference between first $S_1$ and second $S_2$ output terminals, according to the temperature gradient to which it is subjected. What is meant by temperature gradient is the temperature difference between hot side 12 and cold side 11.

As illustrated in FIG. 1, thermocouple 15 is preferably U-shaped and comprises first 13 and second 14 legs which are appreciably parallel. Legs 13 and 14 are made from electrically conducting materials and are electrically connected to one another at one of their ends so as to form a thermoelectric junction 16, here at the level of hot side 12. The junction is arranged on the first side whereas the outputs are arranged on second side 11.

The legs of thermocouple 15 are formed from materials of different thermo-electric natures, i.e. materials able to generate the Seebeck effect. For example, semiconductor materials of single-crystal or polycrystalline type have interesting thermoelectric characteristics. First 13 and second 14 legs are preferably made from doped semiconductor materials. Here, the parts of legs 13 and 14 which participate in formation of thermocouple 15 are formed from N-doped and P-doped polycrystalline silicon to produce two different thermo-electric materials able to form a thermocouple.

Output terminals $S_1$ and $S_2$ are connected to thermocouple 15 and at least one of the outputs comprises a capacitor. In a particular embodiment, first output terminal $S_1$ and second output terminal $S_2$ respectively comprise first I-1 and second I-2 capacitors. These capacitors are represented in FIGS. 2 and 3.

Figure 2:
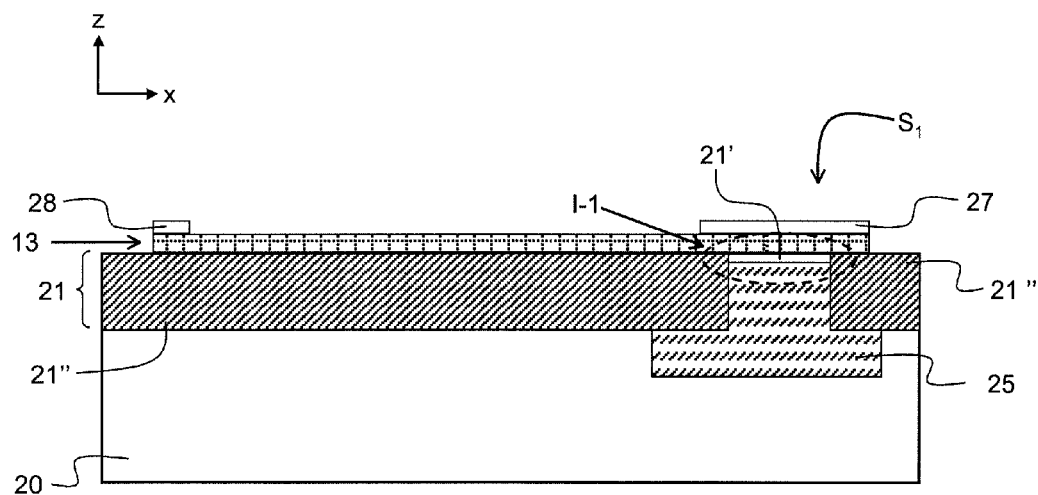
FIG. 2 illustrates a cross-sectional view along the line $xox_1'$ of FIG. 1.
Figure 3:
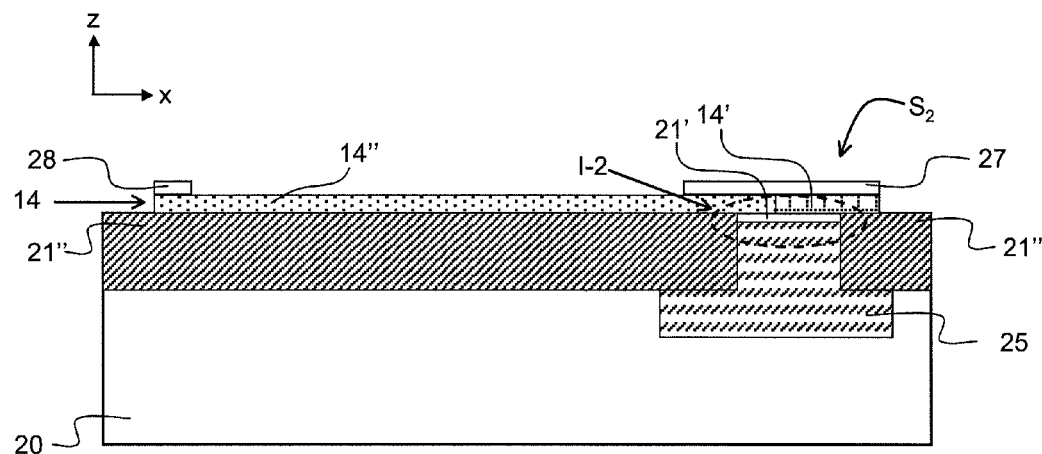
FIG. 3 illustrates a cross-sectional view along the line $xox_2'$ of FIG. 1.

FIGS. 2 and 3 illustrate cross-sectional views along the lines $xox_1'$ and $xox_2'$ of FIG. 1. As illustrated in these cross-sectional views, thermoelectric device 10 comprises a substrate 20 made from semiconductor material. This substrate can be of bulk silicon or germanium type, or made from any other semiconductor material. Substrate 20 can also be of semiconductor on insulator type. Device 10 also comprises an electrically insulating layer 21 which partially covers one surface of substrate 20. Layer 21 separates thermocouple 15 from substrate 20, which enables thermocouple 15 to be electrically insulated from substrate 20. This layer 21 comprises first 21' and second 21" portions. First portion 21' of electrically insulating layer 21 presents a first capacitance per unit area value $C_1$ and second portion 21" presents a second capacitance per unit area value $C_2$ that is lower than the first value.

When two electrically conducting layers are separated by an electrically insulating layer with a thickness e, the latter presents a capacitance per unit area which can be defined according to the equation:

$$C = \frac{\varepsilon_r \cdot \varepsilon_o}{e} \quad (1)$$

where $\varepsilon_r$ represents the relative dielectric permittivity and $\varepsilon_o$ the dielectric permittivity of a vacuum.

The capacitance per unit area values $C_1$ and $C_2$ therefore mainly depend on the nature of the materials used in portions 21' and 21" and on their thicknesses. In an alternative embodiment, the materials of portions 21' and 21" are different, and the material of portion 21" preferably has a lower dielectric permittivity than that of the material of portion 21' in a ratio of 1 to 5. The thicknesses can be in much higher ratios from 10 to 1000 which enables very different capacitances to be obtained. For example, portion 21' can be made from a standard gate oxide (a few tens of Angström) of CMOS technologies and portion 21" can be made from a thick oxide of these same technologies (a few hundred nanometres).

As illustrated in FIG. 2, first leg 13 of thermocouple 15 extends over portion 21' and over portion 21". First output terminal $S_1$ is arranged on portion 21' and is formed by first leg 13. First output terminal $S_1$ also comprises first capacitor I-1 which presents a capacitance per unit area value equal to $C_1$. Capacitor I-1 in fact comprises a first electrode formed by first leg 13 and a second electrode formed by a part 25 of substrate 20. This part of the substrate is separated from the first electrode by first portion 21' of the electrically insulating layer and is arranged in such a way as to be facing first leg 13. First leg 13 forms output $S_1$ in portion 21' and overlaps second portion 21" of the electrically insulating layer to connect thermocouple 15 with output $S_1$. In this configuration, leg 13 forms a part of thermocouple 15, a part of capacitor I-1 and output terminal $S_1$.

In similar manner in a preferred embodiment, and as illustrated in FIG. 3, second leg 14 of thermocouple 15 extends over portion 21' and over portion 21". Second output terminal $S_2$ comprises a second capacitor I-2. A first electrode of this capacitor is formed by second leg 14 made from electrically conducting material. Capacitor I-2 also comprises a second electrode formed by a part 25 of substrate 20. This part of the substrate is separated from the first electrode by first portion 21' of the electrically insulating layer and is arranged in such a way as to be facing second leg 14. Capacitor I-2 then presents a capacitance per unit area value equal to $C_1$. Second leg 14 forms output terminal $S_2$ in portion 21' and overlaps second portion 21" of the electrically insulating layer to connect thermocouple 15 with output $S_2$. In this configuration, leg 14 forms a part of thermocouple 15, a part of capacitor I-2 and output terminal $S_2$.

This particular architecture enables one or two capacitors to be integrated on the output of thermoelectric device 10, in immediate proximity and between outputs $S_1$ and $S_2$ without resulting in overloading of the substrate. This area would furthermore in no way be used to integrate components. In operation, the capacitors will act as decoupling capacitors and will limit the electric disturbances caused by electric signals in the interconnections passing close to device 10. Generally, a capacitance of about 10 fF to 1 pF is associated with each of the output terminals of a device such as thermoelectric device 10. Preferably, the electric capacitance of capacitors I-1 and I-2 is comprised between 100 fF and 10 pF.

For example purposes, with a thickness of 3 nm of a first portion 21' made from silicon oxide, capacitors I-1 and I-2 will have an electric capacitance per unit area value of about $11.5*10^{-3}$ F/m². Consequently, with a portion of first 13 and second 14 legs having a surface of 40 μm² and forming the first electrode of capacitors I-1 and I-2, the electric capacitance of capacitors I-1 and I-2 would be about 500 fF.

According to a particular embodiment which can be combined with the previous embodiments, the substrate is of a first type of conductivity and comprises an area 25 doped with a second type of conductivity which forms a P/N junction with an adjacent area of substrate 20 enabling electric insulation to be ensured. Parasitic disturbances present in substrate 20 are thereby not propagated to outputs $S_1$ and $S_2$ of thermocouple 10. As illustrated in FIGS. 2 and 3, this area 25 is arranged so as to be facing first portion 21' of electrically insulating layer 21 and to form the second electrode of capacitor I-1 or of capacitors I-1 and I-2. Such a doping enables the electric resistivity of this part of the substrate, and thereby that of the second electrode of capacitors I-1 and I-2, to be reduced.

In a preferred embodiment, area 25 is of the same type of conductivity as the portion of the leg which covers it.

According to another embodiment which can be combined with the previous embodiments, first leg 13 which connects output $S_1$ to thermoelectric junction 16 is of a single type of conductivity and second leg 14 comprises first 14' and second 14" portions. Second leg 14 connects output $S_2$ to a thermoelectric junction, for example the junction with leg 13. First portion 14' of second leg 14 has the same type of conductivity as first leg 13 and is arranged above first portion 21' of the electrically insulating layer. Second portion 14" is of the opposite type of conductivity to first portion 14' and to first leg 13. Portions 14' and 14" are aligned to form a leg and second portion 14" forms the junction 16 with leg 13. As illustrated in FIG. 3, first portion 14' participates in formation of the first electrode of second capacitor I-2 (or of first capacitor I-1). According to this embodiment, capacitors I-1 and I-2 comprise first electrodes formed from the same materials and having the same types of conductivity, which enables the electric behaviour of capacitors I-1 and I-2 to be similar to one another. In the particular case where the second electrodes are also formed from the same materials, the capacitors have substantially identical electrical responses.

In the previous embodiment, first 14' and second 14" portions of second leg 14 have opposite types of conductivity and are electrically connected. The two portions 14' and 14" form an electric P/N junction at the level of cold side 11. This electric junction can give rise to formation of a stray thermocouple comprising portions 14' and 14". This stray thermocouple can disturb normal operation of thermocouple 15 and of thermoelectric device 10.

In a particular embodiment illustrated in FIG. 3, a layer 27 made from an electrically conducting material, for example a metallic material or a silicide, forms a short-circuit between first 14' and second 14" portions of second leg 14. Layer 27 in fact covers portion 14' and the junction between portion 14' and portion 14".

In a particular embodiment which can be combined with the previous embodiment, for reasons of electric and thermal equivalence between the two output terminals $S_1$ and $S_2$, this same layer 27 is also formed above leg 13. In order to thermally balance the parts of first 13 and second 14 legs which participate in formation of thermocouple 15, a layer 28 made from an electrically conducting material can also be arranged above the ends of these legs located at the level of hot side 12. Layer 28 performs the electric contact between legs 13 and 14.

Layers 27 and 28 are preferably from the same electrically conducting material such as a silicide, a metal etc. On account of higher thermal conductivities than those of the materials forming legs 13 and 14, the layers having a metallic material base generally enable an efficient heat diffusion. A better harmonization of the temperature of legs 13 and 14 can in this way be obtained at the level of cold side 11 and of hot side 12. As a part of the structure of thermocouple 15 is formed above area 21' and another part is formed above area 21", it is advantageous to associate different thermal performances with these two areas.

In a preferred embodiment which can be combined with the previous embodiments, first portion 21' presents a first thermal resistance value Rth1 and second portion 21" presents a second thermal resistance value Rth2 that is higher than the first value. The thermal influence of the substrate at the level of area 21' and of output terminals $S_1$ and $S_2$ is greater than at the level of junction 16 which is arranged on portion 21". The influence of the substrate is thereby limited to one end of device 10, here cold side 11, and the junction temperature can for example be taken as reference temperature. Portions 21' and 21" are preferably formed from the same electrically insulating material and respectively have a first thickness e' and a second thickness e". The thicknesses are in this case chosen in such a way that first thickness e' in smaller than second thickness e".

In the case where the substrate underneath portion 21' forms the cold source, this characteristic of portion 21" slows down the heat diffusion from the hot side of legs 13 and 14 to substrate 20. This enables a maximum heat gradient to be kept between junction 16 and output terminals $S_1$ and $S_2$.

In the case where active or passive cooling means are applied on the rear surface of the substrate (the opposite surface to device 10), the temperature of the substrate is the minimum temperature present in device 10. The rear surface represents the cold source of the gradient. As the thermal conductivity in the substrate is considerably greater than the thermal conductivity of areas 21' and 21", the cold source of the gradient is formed by area 25. By choosing this reference temperature, the difference between the temperatures of cold side 11 and hot side 12 can be increased, which enables the sensitivity of the thermocouple to be improved.

Each of the legs participating in formation of thermocouple 15 thus advantageously has one end which is both electrically insulated and thermally connected to substrate 20. Here, this end is placed at the level of cold side 11. The rest of the legs are preferably electrically and thermally insulated from substrate 20 made from semiconductor material in order to have a maximum temperature gradient.

Indeed and as illustrated in FIGS. 2 and 3, the parts of legs 13 and 14 which form thermocouple 15 are arranged above second portion 21" of the electrically insulating layer. Each of these parts comprises an end which is arranged above first portion 21' of the electrically insulating layer. Portion 21' advantageously presents a first thermal resistance value Rth1 and portion 21" presents a second thermal resistance value Rth2 that is higher than the first value.

In a particular embodiment, portions 21' and 21" are formed from the same electrically insulating material, for example silicon oxide. They respectively have thicknesses e' and e" chosen such that e' is smaller than e". According to this configuration, the conditions on the thermal resistances Rth1 and Rth2 and on the capacitances per unit area $C_1$ and $C_2$ are verified simultaneously. Preferably, e' is about a few Angström. The temperature of the leg at the level of cold side 11 is thus advantageously close to that of substrate 20. The thickness of portion 21' can be comprised for example between 3 and 200 Å and the thickness of portion 21" can be comprised between 100 and 1000 nm.

In an alternative embodiment, the materials of portions 21' and 21" are different and the material of layer 21' preferably has a higher thermal conductivity than that of the material of layer 21".

Figure 4:
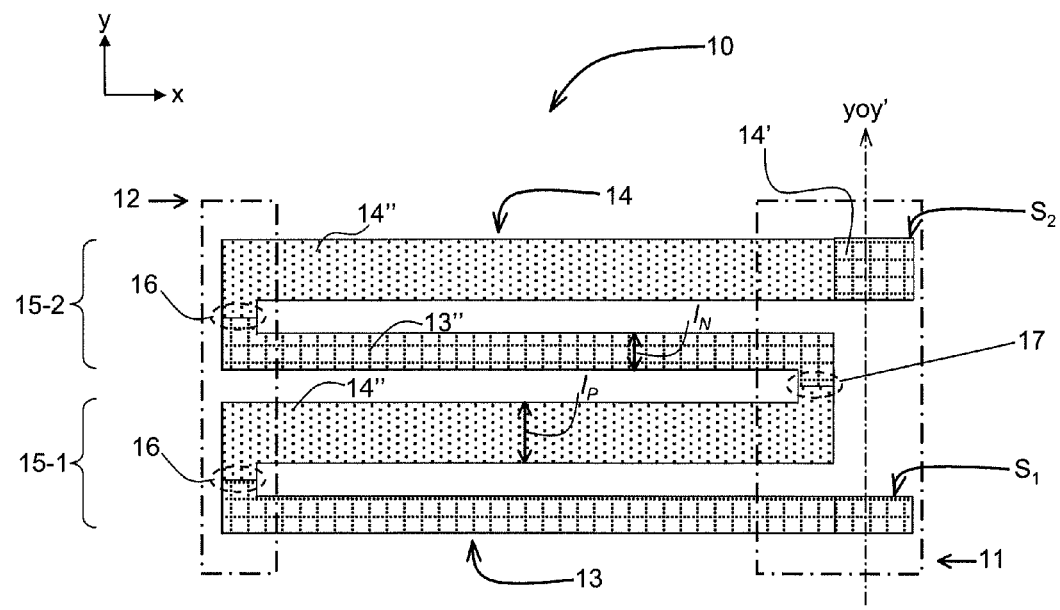
FIG. 4 schematically illustrates a top view of an alternative embodiment of a thermoelectric device.

FIG. 4 schematically illustrates a top view of another embodiment of thermoelectric device 10. As illustrated in this figure, thermoelectric device 10 comprises similar elements to those illustrated in FIG. 1, designated by the same reference numerals. Output terminals $S_1$ and $S_2$, cold side 11 and hot side 12, first leg 13 and second leg 14, and junction 16 formed by the legs participating in formation of a thermocouple are in particular to be found. The same alternative embodiments described in the foregoing can be integrated.

According to this embodiment, thermoelectric device 10 comprises two thermocouples 15-1 and 15-2 similar to thermocouple 15 of FIG. 1. Thermo-couples 15-1 and 15-2 are electrically connected via a junction 17. Thermo-couples 15-1 and 15-2 are electrically in series and thermally in parallel in the temperature gradient. Each of thermocouples 15-1 and 15-2 is arranged in such a way as to have one end at the level of hot side 12 and the other end at the level of cold side 11. First leg 13 participates in formation of thermo-couple 15-1 and of first output terminal $S_1$ and second leg 14 participates in formation of thermocouple 15-2 and of second output terminal $S_2$. In order to complete thermocouples 15-1 and 15-2, additional legs 13" and 14" are formed. The different legs are parallel to one another with a bent part to have a connection.

In order to increase the sensitivity of the thermoelectric device, the latter can comprise more than two thermocouples electrically connected in series. Device 10 preferably comprises between 1 and 100 thermocouples and even more if necessary. In an embodiment which can be combined with the previous embodiments, the thermoelectric device comprises m thermo-couples, m being an integer greater than or equal to 1. The m thermocouples are formed by legs made from electrically conducting material. These legs are arranged in the form of a "crenel" and can be formed for example from a semiconductor material so that two adjacent legs connected to one another have two different types of conductivities. The arrangement of the legs in the form of a "crenel" advantageously enables the surface of a substrate used for producing device 10 to be minimized. Under these conditions, the m thermocouples are electrically connected in series and are formed by (2*m) legs forming a number of P/N junctions equal to (2*m−1).

The legs of the thermocouples of device 10 are preferably formed by means of CMOS or BiCMOS technology. Doping of the legs can therefore be performed by usual N-type and P-type ion implantations for producing standard MOS transistors. Under these conditions, it is possible for the electric resistances of the N-doped and P-doped legs to be different. Under certain production conditions, a factor 2 to 3 between the resistivities of the two N-doped and P-doped legs may exist. In order to compensate this resistivity difference when the doping levels are fixed (for example by the other components of the circuit), a suitable adjustment of the geometric dimensions of the legs forming the thermocouples of device 10 can be envisaged: for a given surface of the differential temperature sensor, the Seebeck electromotive force between $S_1$ and $S_2$ will be as high as possible and the series resistance introduced by the material of legs 13 and 14 will be as low as possible.

As illustrated in FIG. 4, the thermocouples of device 10 are thermally in parallel, i.e. arranged in the same thermal gradient imposed by hot side 12 and cold side 11. These thermocouples are formed by legs arranged in the form of a "crenel" extending continuously in the lengthwise direction of the legs from hot side 12 to cold side 11. Thus, according to this embodiment, the legs of device 10 are parallel and have the same length L which is about the same as the distance separating hot side 12 and cold side 11. The thickness, the dimension along the "z" axis, of the legs can also be chosen according to technological considerations. In CMOS or BiCMOS technology, the legs are in fact preferably deposited simultaneously and they have one and the same thickness.

In an embodiment which can be combined with the previous embodiments, at least one of the legs forming the outputs of thermoelectric device 10 is longer than the other legs of device 10.

As illustrated in FIG. 4, the legs forming thermocouples 15-1 and 15-2 advantageously have different widths $I_N$ and $I_P$ according to the type of conductivity of the legs. These widths $I_N$ and $I_P$ are chosen so as to control the electric resistances of the legs forming thermocouples 15-1 and 15-2.

Figure 5:
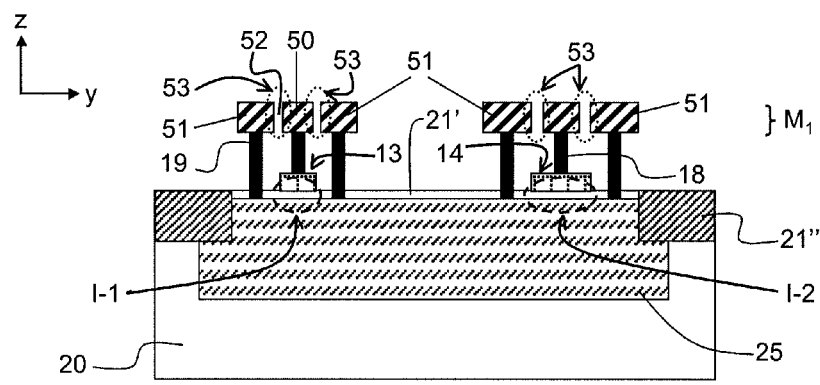
FIG. 5 illustrates a cross-sectional view along the line yoy' of FIG. 4.

In a particular embodiment illustrated in FIG. 5, an increase of the value of the capacitance associated with outputs $S_1$ and $S_2$ can be performed by means of electric contacts connecting a metallization level with substrate 20 and output terminals $S_1$ and $S_2$. This embodiment can also be combined with the previous embodiments.

FIG. 5 illustrates a cross-sectional view along the line yoy' of FIG. 4. At least first 50 and second 51 metallic lines are respectively connected to the leg of one of the outputs of device 10 and to area 25 of substrate 20, i.e. the second electrode of the capacitor of this output. First metallic line 50 is connected to the output via a contact 18, and line 51 is connected to area 25 via a contact 19. Metallic lines 50 and 51 are adjacent and separated from one another by a layer 52 made from electrically insulating material, for example a silicon oxide, a silicon nitride, a vacuum or a gas. A capacitor 53 of Metal/Insulator/Metal (MIM) type can thereby be formed by the two adjacent metallic lines 50 and 51. Capacitor 53 is arranged in a different plane from the plane of the outputs of device 10 parallel to the surface of the substrate and of the first leg. The capacitance value of capacitor 53 is a function of the facing surface between lines 50 and 51, of the air-gap value between these two lines and of the material separating them. Contacts 18 and 19 can also play a role in the capacitance value depending on the architectures used. For the sake of clarity, electric contacts 18, 19 and lines 50, 51 have not been illustrated in FIGS. 1 and 4.

In a preferred embodiment, outputs $S_1$ and $S_2$ comprise metal contacts 18 arranged above legs 13 and 14. Metal contacts 19 are located at the level of cold side 11. Several contacts 19 are formed for a contact 18 and they are formed in such a way that at least two contacts 19 are separated by leg 13 and at least two other contacts 19 are separated by leg 14. Contacts 18 electrically connect outputs $S_1$ and $S_2$ with metal lines 50 which overlap them. Contacts 19 electrically connect the areas of substrate 20 with metal lines 51 which overlap them. Lines 50 and 51 belong to the same metallization level for the same output, here a level $M_1$. Other metallization levels can also be arranged above level $M_1$ to increase the value of the capacitors added in parallel to capacitors I-1 and I-2.

Contacts 19 also enable a thermal connection between substrate 20 via area 25 and second metallic lines 51. Increasing the number of contacts 19 enables the heat transfer of the substrate through film 21' to be increased, thereby increasing the effect of the thermal gradient between cold area 11 and hot area 12. In advantageous manner, contacts 19 are formed on each side of contact 18 to have a homogeneous distribution of the temperature of the substrate. Electric contacts 18 and 19 can be formed by pads made from electrically conducting materials. These contacts can for example be made from Cu or from Ti/Au. Metal lines 50 and 51 can for example be made from Cu or any other metallic material usually used in the CMOS/BiCMOS technology to make interconnections.

As illustrated in FIG. 5, capacitors 53 comprise first electrodes formed by metal lines 50 which are connected to first 13 and second 14 legs via contacts 18. The second electrodes of capacitors 53 are further formed by metal lines 51 which are connected to the second electrodes of capacitors I-1 and I-2 via contacts 19. Each of the capacitors I-1 and I-2 is thus electrically arranged in parallel with at least one capacitor, for example two capacitors 53. The cross-sectional view of FIG. 5 can represent two capacitors 53 associated with leg 14 and two capacitors 53 associated with leg 13, each pair of capacitors having line 50 as common electrode. The cross-sectional view of FIG. 5 can also represent a single capacitor 53 of cylindrical or semi-cylindrical shape with electrode 50 which is surrounded or partially surrounded by the same metal line 51. In this particular architecture, a single line 19 can be used.

Output terminals $S_1$ and $S_2$ thus each comprise at least two capacitors in parallel. These capacitors are equivalent to a single capacitor I-eq having an electric capacitance value of the order of the sum of the capacitance values of the different capacitors connected in parallel. Capacitors 53 consequently advantageously enable the value of the electric decoupling capacitance at output terminals $S_1$ and $S_2$ to be increased.

According to this embodiment, output terminals $S_1$ and $S_2$ are advantageously provided with capacitors I-eq made by means of CMOS/BiCMOS technology and having higher capacitance per unit area values than $C_1$. These capacitors enable a better protection of thermoelectric device 10 against possible electric disturbances.

Locating metal lines 50, 51 and contacts 18, 19 in the vicinity of output terminals $S_1$ and $S_2$ also enables harmonization of the temperature at the level of cold side 11 at a temperature close to that of substrate 20. These lines and these contacts are in fact preferably formed from metal materials which, on account of their high thermal conductivity, enable an efficient dissipation of the heat flux.

Figure 6:
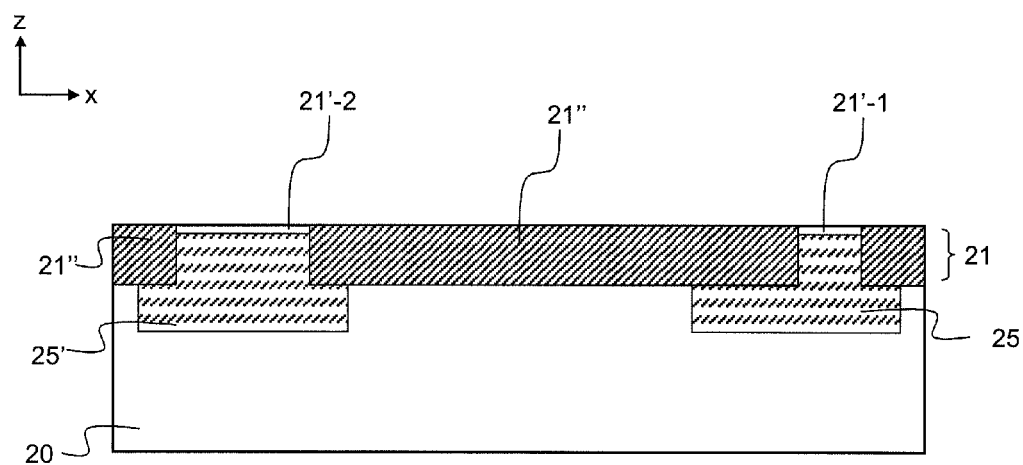
FIGS. 6 to 8 illustrate successive steps of an embodiment of a thermoelectric device and of a field effect transistor.
Figure 7:
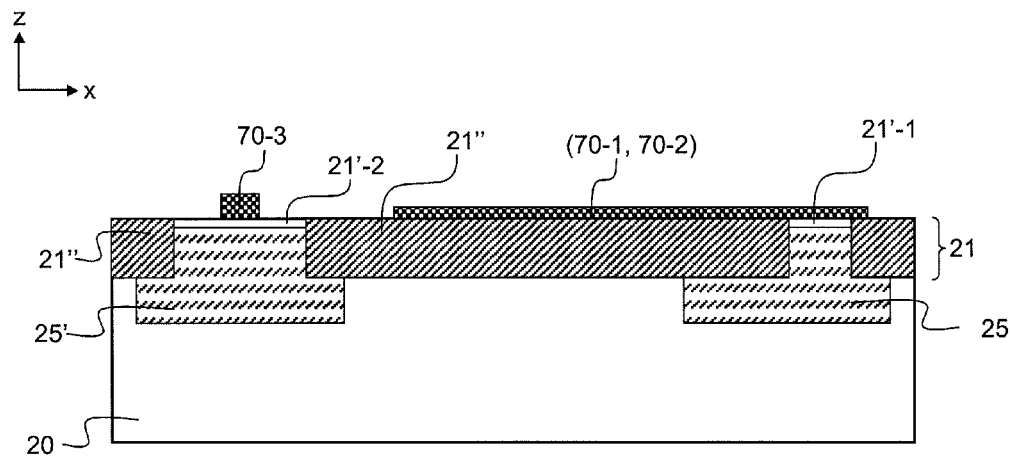
Figure 8:
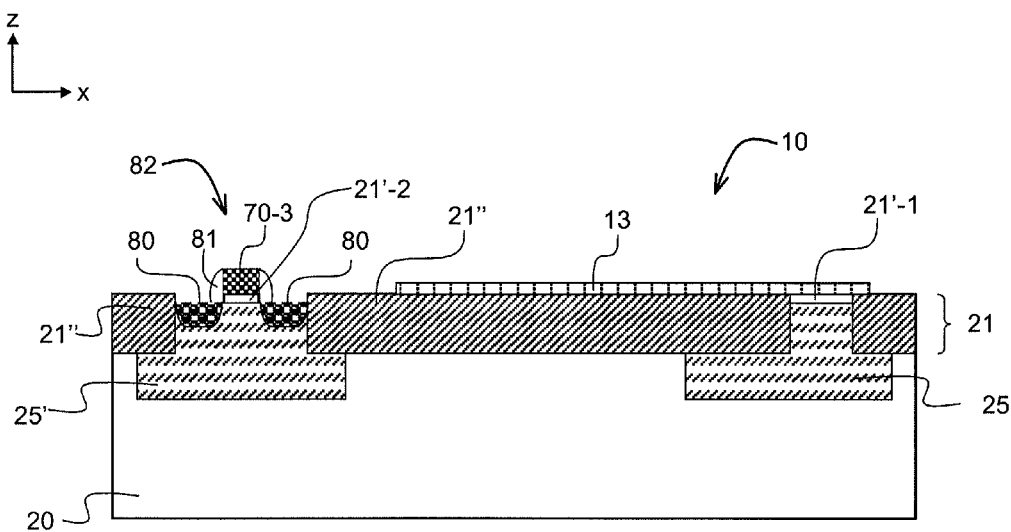

FIGS. 6 to 8 illustrate successive steps of a method for producing a thermoelectric device 10 and an active device in CMOS or BiCMOS technology.

FIG. 6 illustrates an initial substrate 20 made by following usual steps of the CMOS/BiCMOS technology. Substrate 20 can be doped so as to have a first type of conductivity. An electrically insulating layer 21 partially covering one surface of substrate 20 can also be distinguished. Electrically insulating layer 21 comprises first 21'-1, second 21" and third 21'-2 portions.

First 21'-1 and third 21'-2 portions present the same capacitance per unit area value and second portion 21" presents a second capacitance per unit area value that is lower than the first value. First 21'-1 and third 21'-2 portions also present the same first thermal conductance value and second portion 21" presents a second thermal conductance value that is lower than the first value. What is by thermal conductance is the opposite of thermal resistance.

First 21'-1 and third 21'-2 portions are preferably separated by second portion 21". The three portions of the electrically insulating layer can be formed from different materials or from the same material. In a particular embodiment, first 21'-1 and third 21'-2 portions are formed by the same electrically insulating film, whereas second portion 21" is formed from another electrically insulating film.

In a preferred embodiment, the portions of electrically insulating layer 21 are based on silicon oxide ($SiO_2$). First 21'-1 and third 21'-2 portions can be based on silicon oxide generally used as gate dielectric. They can be formed simultaneously and can have the same thickness e'. Second portion 21" can be formed in the same manner as a Shallow Trench Isolation (STI) which is sunk into the substrate. Second portion 21" can have a larger thickness e" than thickness e'. In this manner, the capacitance per unit area and thermal conductance values of portion 21" are lower than those of portions 21'-1 and 21-2. For example purposes, second portion 21" is at least partially formed before first 21'-1 and third 21'-2 portions.

Substrate 20 may comprise first 25 and second 25' areas doped so as to have the second type of conductivity. These areas 25 and 25' thus form P/N junctions with adjacent areas of substrate 20. Preferably, areas 25 and 25' are doped simultaneously by means of usual ion implantation used for producing transistors. Areas 25 and 25' are located in substrate 20 in such a way that they are respectively facing first 21'-1 and third 21'-2 portions of electrically insulating layer 21. In a particular embodiment, areas 25 and 25' are formed before first 21'-1 and third 21'-2 portions.

As illustrated in FIG. 7, first 70-1 and second 70-2 legs made from electrically conducting material are formed above electrically insulating layer 21. Legs 70-1 and 70-2 extend above first 21'-1 and second 21" portions of electrically insulating layer 21. The materials of legs 70-1 and 70-2 are chosen such that these legs can participate in formation of at least one thermocouple. A third leg 70-3 made from electrically conducting material is also formed above third portion 21'-2 of electrically insulating layer 21.

In a particular embodiment which can be combined with the previous embodiments, legs 70-1, 70-2 and 70-3 are formed simultaneously and are based on same material. The three legs are for example made from polycrystalline silicon. In this configuration, legs 70-1 and 70-2 can act as base elements to form a thermoelectric device of the same type as device 10. The stack formed by leg 70-3 which is arranged above third portion 21'-2 of the electrically insulating layer can advantageously be used to make a gate stack for producing a field effect transistor in CMOS technology.

Indeed, as illustrated in FIG. 8, legs 70-1 and 70-2 can subsequently be doped so as to have different types of conductivity. To do this, usual ion implantation steps can be implemented to form N-doped and P-doped first 13 and second 14 legs. These implantation steps can also be used to produce source and drain areas 80 after a gate electrode delineation step. For example, a usual photolithography step can be used to selectively eliminate third portion 21'-2. The legs of the thermocouple and of the gate electrode are thus delineated simultaneously with the same photolithography step and the same etching step. Doping of the thermocouple legs can be performed when doping of the gate electrode is performed.

It has thus been possible to produce three essential elements of a usual field effect transistor 82: source and drain areas 80 and gate stack 70-3/21'-2. This method advantageously makes it possible to perform co-integration of a thermoelectric device of the same type as device 10 and of a usual active CMOS/BiCMOS technology device such as a field effect transistor. This transistor formed in this way can be encapsulated by layers 81 made from electrically insulating material, for example silicon oxide or nitride. These layers 81 are commonly called spacers and serve the purpose of electrically insulating the gate from the source and drain areas 80.

The invention claimed is:

1. A thermoelectric device, comprising:
   a substrate made from a semiconductor material;
   an electrically insulating layer covering a first face of the substrate and comprising a first portion presenting a first value of capacitance per unit area and a second portion presenting a second value of capacitance per unit area that is lower than the first value;
   at least one thermocouple comprising a plurality of legs, the legs being electrically conducting, each of the legs being placed on the electrically insulating layer and separated from the substrate by the electrically insulating layer only,
   wherein a bottom surface of each of the legs of the at least one thermocouple, a top surface of the first portion of the electrically insulating layer, and a top surface of the second portion of the electrically insulating layer are substantially coplanar, and
   wherein a first leg of the plurality of legs is made from a first electrically conducting material, the first leg being disposed on the first portion of the electrically insulating layer and overlapping the second portion of the electrically insulating layer;
a first output terminal connected to the at least one thermocouple by the first leg, the first output terminal comprising a first capacitor provided with:
a first electrode of the first capacitor formed by the first leg, and
a second electrode of the first capacitor formed by a part of the substrate facing the first leg, the first electrode of the first capacitor and the second electrode of the first capacitor being separated from one another by the first portion of the electrically insulating layer.

2. The thermoelectric device according to claim 1, further comprising:
a second output terminal,
wherein a second leg of the plurality of legs is made from a second electrically conducting material and overlaps the second portion of the electrically insulating layer to connect the second output terminal to one thermocouple of the at least one thermocouple, the second output terminal comprising a second capacitor provided with:
a first electrode of the second capacitor formed by the second leg, and
a second electrode of the second capacitor formed by another part of the substrate facing said second leg, the second electrode of the second capacitor being separated from the first electrode of the second capacitor by the first portion of the electrically insulating layer.

3. The thermoelectric device according to claim 1, wherein:
a first area of the substrate facing the first portion of the electrically insulating layer is doped with a first type of doping so as to form a P/N junction with an adjacent area of the substrate,
a second area of the substrate facing the second portion of the electrically insulating layer is doped with a second type of doping opposite to the first type.

4. The thermoelectric device according to claim 1, wherein the at least one thermocouple belongs to a first plane and wherein the thermoelectric device further comprises:
a first metal line connected to the first leg; and
a second metal line connected to the second electrode of the first capacitor, the first metal line and the second metal line being separated from one another by a dielectric layer, the first metal line and the second metal line being arranged in a second plane that is substantially parallel to the first plane and different from the first plane.

5. The thermoelectric device according to claim 2, wherein the first leg and the second leg are made from doped semiconductor materials and participate in formation of the at least one thermocouple.

6. The thermoelectric device according to claim 5, wherein:
the first leg has a first type of conductivity and connects a thermoelectric junction to the first output terminal; and
the second leg comprises a first portion and a second portion, the second portion of the second leg having a second type of conductivity different from the first type of conductivity, the first portion of the second leg having the first type of conductivity and being arranged over the first portion of the electrically insulating layer, the first portion of the second leg and the second portion of the second leg being in direct contact so as to form a P/N junction.

7. The thermoelectric device according to claim 6, wherein a layer of a third electrically conducting material is disposed on the second leg and extends from the first portion of the second leg to the second portion of the second leg so as to form a short-circuit between the first portion of the second leg and the second portion of the second leg.

8. The thermoelectric device according to claim 1, wherein the first portion of the electrically insulating layer and the second portion of the electrically insulating layer are configured to present respectively a first thermal resistance value and a second thermal resistance value, the second thermal resistance value being higher than the first thermal resistance value.

9. The thermoelectric device according to claim 1, wherein the at least one thermocouple is provided as a plurality of thermocouples, the plurality of legs being connected to each other by thermoelectric connections such that the plurality of thermocouples are electrically connected in series, the first leg being a longer leg of the plurality of legs.

10. The thermoelectric device according to claim 1, wherein the first portion of the electrically insulating layer has a thickness between 3 Å and 200 Å.

11. The thermoelectric device according to claim 1, wherein the first output terminal is configured to collect an electric current generated by the at least one thermocouple.

12. The thermoelectric device according to claim 1, wherein the first output terminal comprises a pad made from a second electrically conducting material, the pad being in contact with the first leg and being placed on the first leg.

* * * * *